(12) United States Patent
Grundhöfer et al.

(10) Patent No.: US 12,249,964 B2
(45) Date of Patent: Mar. 11, 2025

(54) R-MODE RECEIVER ASSEMBLY

(71) Applicant: Deutsches Zentrum für Luft- und Raumfahrt e.V., Bonn (DE)

(72) Inventors: Lars Grundhöfer, Horneburg (DE); Filippo Rizzi, Neustrelitz (DE)

(73) Assignee: Deutsches Zentrum für Luft- und Raumfahrt e.V., Bonn (DE)

( * ) Notice: Subject to any disclaimer, the term of this patent is extended or adjusted under 35 U.S.C. 154(b) by 32 days.

(21) Appl. No.: 18/138,595

(22) Filed: Apr. 24, 2023

(65) Prior Publication Data

US 2023/0344389 A1 Oct. 26, 2023

(30) Foreign Application Priority Data

Apr. 25, 2022 (DE) .......................... 202022102208.9

(51) Int. Cl.
*H04B 1/00* (2006.01)
*H03F 3/189* (2006.01)
(52) U.S. Cl.
CPC ........... *H03F 3/189* (2013.01); *H04B 1/0003* (2013.01); *H03F 2200/294* (2013.01)
(58) Field of Classification Search
CPC .......... H04B 1/0003; H04B 1/06; H04B 1/16; G01S 7/2883; G01S 1/045; G01S 7/486
See application file for complete search history.

(56) References Cited

U.S. PATENT DOCUMENTS

| | | | | |
|---|---|---|---|---|
| 4,332,032 | A * | 5/1982 | Daniel | H04B 7/082 455/278.1 |
| 2010/0075611 | A1 * | 3/2010 | Budampati | H04L 27/0014 455/67.11 |
| 2020/0371245 | A1 * | 11/2020 | Murphy | G01S 19/30 |
| 2022/0311526 | A1 * | 9/2022 | Nattar Ranganathan | H04B 17/406 |

FOREIGN PATENT DOCUMENTS

WO WO-2023087030 A1 * 5/2023

OTHER PUBLICATIONS

"Boni-Whip Marine Active Antenna", archived webpage dated Aug. 2020 (Year: 2020).*
Panorama SDR "The Direct Sampling SDR Architecture", Jan. 12, 2017. (Year: 2017).*
L. Grundhöfer et al., Positioning with medium frequency R-Mode, Navigation, vol. 68, No. 4, pp. 829-841, Dec. 6, 2021, https://doi.org/10.1002/navi.450.
Example for an RTL-software defined radio receiver module: https://www.rtl-sdr.com/buy-rtl-sdr-dvb-t-dongles.
L. Grundhöfer et al., R-Mode receiver development for medium frequency signals, Scientific Journals of the Maritime University of Szczecin 2018, 56 (128), 57-62, DOI: 10.17402/314.

* cited by examiner

*Primary Examiner* — Sophia Vlahos
(74) *Attorney, Agent, or Firm* — Bonini IP Law, LLC; Frank J. Bonini, Jr.

(57) ABSTRACT

The invention relates to an R-mode receiver arrangement (1) comprising a low-noise amplifier (2), a bandpass filter (3), (Continued)

and an RTL software-defined radio receiver module (4), wherein an input of the low-noise amplifier (2) is configured to be connectable to a receiving antenna (10, 11), wherein an output of the low-noise amplifier (2) is connected to the RTL software-defined radio receiver module (4) via the bandpass filter (3).

17 Claims, 1 Drawing Sheet

R-MODE RECEIVER ASSEMBLY

BACKGROUND OF THE INVENTION

1. Field of the Invention

The invention relates to an R-mode receiver arrangement.

2. Brief Description of the Related Art

Ranging Mode (R-Mode) is a terrestrial navigation system which is currently under development. Said system allows positioning and time measurement up to a distance of several hundred kilometers away if a sufficient number of R-mode signals are available. In particular, said system is designed to complement global navigation satellite systems (GNSS) so that a multi-system radio navigation receiver can continuously support users with reliable position, navigation, and timing (PNT) data for navigation tasks. This is especially important when GNSS is unavailable or has degraded performance due to intentional or unintentional interference.

At the current stage of development, the R-mode system is planned as a secondary or backup system, primarily for maritime use. Maritime user requirements for horizontal position accuracy for such a system are defined in the International Association of Marine Aids to Navigation and Lighthouse Authorities (IALA) Recommendation R-129 as 100 m for coastal navigation and 10 m for port approach and navigation in restricted waters (IALA, 2012).

Feasibility studies have shown that R-mode can be achieved for example if medium frequency (MF) marine radio beacons or automatic identification system (AIS) base stations operating in the very high frequency (VHF) band are modified to transmit synchronized R-mode signals.

The article L. Grundhöfer et al, Positioning with medium frequency R-mode, NAVIGATION, Vol. 68, No. 4, pages 829-841, Dec. 6, 2021, https://doi.org/10.1002/navi.450, describes a method for estimating phases by means of a fast Fourier transform and determining a position by means of medium frequency (MF) R-mode.

SUMMARY OF THE INVENTION

The invention is based on the object of improving an R-mode receiver arrangement.

According to the invention, the object is achieved by an R-mode receiver arrangement having the features of claim 1. Advantageous embodiments of the invention can be found in the subclaims.

In particular, an R-mode receiver arrangement is provided, comprising a low-noise amplifier, a bandpass filter, and an RTL software-defined radio receiver module, wherein an input of the low-noise amplifier is configured to be connectable to a receiving antenna, wherein an output of the low-noise amplifier is connected to the RTL software-defined radio receiver module via the bandpass filter.

One advantage of the proposed R-mode receiver arrangement is that said arrangement can be provided at a particularly low cost and can thus be widely used.

The low-noise amplifier can for example be a Mini-Circuit ZFL-500Ln+ type low-noise amplifier.

The RTL software-defined radio receiver module is specifically a receiver module which is based on the RTL2832U chipset from the company Realtek. For example, the RTL-SDR Blog V3 can be used as the receiver module (for example RTL-SDR Blog V3 R820T2 RTL2832U 1PPM TCXO SMA software-defined radio, https://www.rtl-sdr-.com/buy-rtl-sdr-dvb-t-dongles/). In particular, the RTL software-defined radio receiver module can be modified in such a way that required frequency ranges of a few hundred kHz can be received. For this purpose, it may be provided that the receiver module is modified according to the manufacturer's specifications.

In one embodiment, it is provided that the RTL software-defined radio receiver module is configured to operate in a direct-sampling mode. In particular, a tuner stage is deactivated and the sampled values are processed and/or provided directly.

In one embodiment, it is provided that the R-mode receiver arrangement comprises a computing device, wherein the computing device is configured to receive an output signal of the RTL software-defined radio receiver module and to perform a Fourier transform on the output signal, in order to estimate phases of both carrier signals of an R-mode signal and to provide and/or output the estimated phases. The computing device can for example be a personal computer, a miniature computer, or an embedded computer. The computing device can comprise in particular a microprocessor or microcontroller and a memory. The computing device is in particular configured to perform a discrete Fourier transform (DFT), particularly via a fast Fourier transform (FFT). This makes it possible in particular to observe all channels with a single estimate.

In particular, a discrete Fourier transform (DFT) is performed for phase estimation. The discrete Fourier transform corresponds to a parametric maximum likelihood estimation, for the case in which the center frequencies of the resulting frequency bins coincide with the audio frequency to be estimated. The connection is explained in greater detail in the article cited at the outset, L. Grundhöfer et al., Positioning with medium frequency R-Mode, and is briefly outlined below.

A phase estimate for a continuous wave is assumed. Here for example the following signal model can be assumed, in which a single tone i (for example a sinusoidal signal) can be described over time t as:

$$b_i \sin(\omega_i t + \theta_i)$$

having the three parameters frequency $\omega_i$, amplitude $b_i$, and phase $\theta_i$. It is assumed that the frequency is known. The amplitude and in particular the phase must be estimated in the medium-wave range. Since a discretely sampled signal is used, or the receiver module provides a discrete signal, time t can be quantized to $t_n$ having a constant sampling rate $f_{Abtast}$:

$$t_n(n) = t_0 + n \frac{1}{f_{Abtast}} = (n_0 + n) \frac{1}{f_{Abtast}}$$

In this case, a limit can be specified by:

$$\mathrm{var}\{\hat{\theta}_i\} \geq \frac{\sigma^2}{b_i^2 N}$$

for a complex signal model, where $\hat{\theta}_i$ is the estimated phase, $\sigma^2$ is the variance in the power density function (PDF) of the noise, and N is the number of samples.

To obtain the phase estimate, in particular a maximum likelihood estimation is performed. The likelihood function is given by:

$$L = \sum_{i=1}^{k} \{2b_i \mathrm{Re}[e^{j\theta_i} A(\omega_i)] - b_i^2\} \text{ with}$$

$$A(\omega) = \frac{1}{N} \sum_{n=0}^{N-1} (X_n + jY_n) e^{-jn\omega_i \Delta t}$$

where X is an input vector of samples and Y is the corresponding Hilbert transform. Both vectors have a length N and are indexed by n. k is the number of tones to be estimated, wherein each tone is defined according to the signal model, i indexes the current frequency to be evaluated within the sum. In order to find the parameters that maximize L, $A(\omega_i)$ must be maximized. The estimates are therefore obtained via:

$$\hat{b}_i = |A(\omega_i)|$$

and $$\hat{\theta}_i = \arg[e^{-j\omega_i t_0} A(\omega_i)]$$

It is assumed here that the frequency $\omega_c$ of the tone is known, so that estimates $\hat{\theta}_i$ for the phase and $\hat{b}_i$ for the amplitude are obtained. To subsequently estimate a distance, phase estimates for different tones simultaneously are of interest. Therefore, the discrete Fourier transform is used for a parametric estimation, since $A(\omega)$ can generally be described using the DFT basis functions:

$$e^{-j2\pi \frac{K}{N} n} \text{ with}$$

$$\omega = 2\pi \frac{K f_{Abtast}}{N}$$

where K describes a point in the DFT spectrum. This yields the matrix representation:

$$A(\omega) = \frac{1}{N}(X - jY)^T \begin{pmatrix} e^{-j0\Delta\omega t} \\ e^{-j1\Delta\omega t} \\ \ldots \\ \ldots \\ e^{-jN\Delta\omega t} \end{pmatrix}$$

which is a column of the transform matrix of the DFT. In particular, a fast Fourier transform is performed to estimate the phases. The fast Fourier transform provides an efficient method for estimating N bins. The center frequencies of these bins are uniformly distributed at intervals of $\Delta\omega$ and must match the frequencies of the continuous-wave frequencies that are to be estimated. This estimation procedure yields complex numbers in which the phase is the phase information sought at the beginning of the observed time interval with length T. The phase to be estimated corresponds to an angle of the complex number.

In one embodiment, it is provided that the computing device is further configured to estimate and provide and/or output a pseudorange based on the estimated phases. This can be done, for example, as described in the article cited at the outset, L. Grundhöfer et al., Positioning with medium frequency R-Mode.

In one embodiment, it is provided that the bandpass filter has a passband from 250 kHz to 375 kHz. This allows a frequency range of interest around 300 kHz to be specifically cleaned of other interference.

It is further provided that the bandpass filter is a passive filter formed by discrete components. It is thereby possible to increase phase stability.

In one embodiment, it is provided that the computing device is further configured to correct for phase drift.

In one embodiment, it is provided that the R-mode receiver arrangement comprises an E-field antenna which has a circular receiving pattern and which is connected to the input of the low-noise amplifier. Such an antenna is particularly suitable for mobile applications.

In one embodiment, it is provided that the R-mode receiver arrangement comprises an H-field antenna which has a directional characteristic and a reduced noise floor and which is connected to the input of the low-noise amplifier. Such an antenna is particularly suitable for a stationary application.

BRIEF DESCRIPTION OF THE DRAWING FIGURES

The invention will be described in greater detail below with the aid of preferred exemplary embodiments, making reference to the figures. In the drawings.

DETAILED DESCRIPTION OF THE INVENTION

Figure 1:
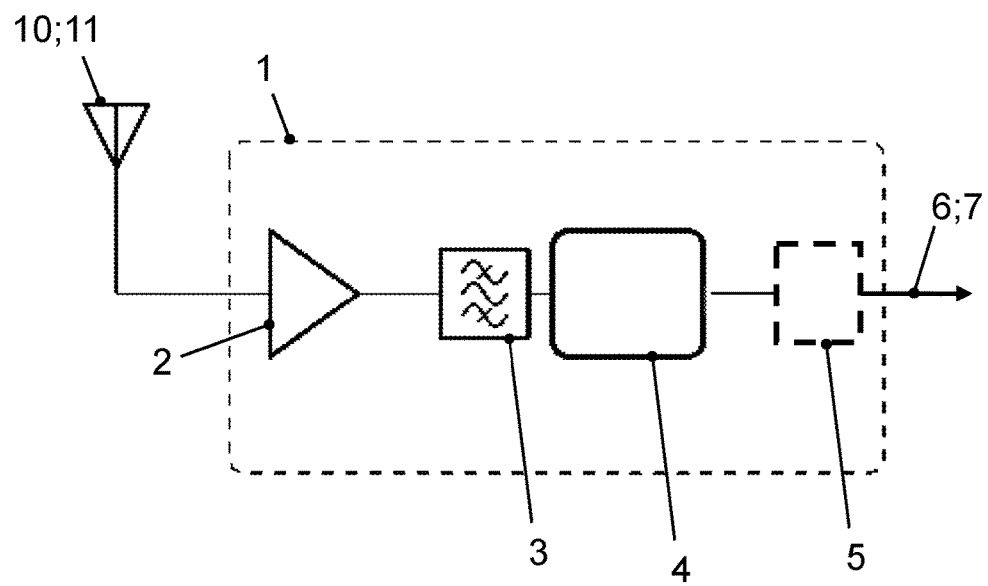
FIG. 1 shows, schematically, a representation of an embodiment of the R-mode receiver arrangement.

FIG. 1 shows a schematic diagram of one embodiment of the R-mode receiver arrangement 1. The R-mode receiver arrangement 1 comprises a low-noise amplifier 2, a bandpass filter 3, and an RTL software-defined radio receiver module 4.

An input of the low-noise amplifier 2 is configured to be connectable to a receiving antenna 10, 11, wherein an output of the low-noise amplifier 2 is connected to the RTL software-defined radio receiver module 4 via the bandpass filter 3.

In particular, it is provided that the RTL software-defined radio receiver module 4 is configured to operate in a direct-sampling mode. The RTL software-defined radio receiver module 4 provides an (SDR) data stream of the sampled values.

It may be provided that the R-mode receiver arrangement 1 comprises an E-field antenna 10 which has a circular receiving pattern and which is connected to the input of the low-noise amplifier 2.

It may be alternatively provided that the R-mode receiver arrangement 1 comprises an H-field antenna 11 which has a directional characteristic and a reduced noise floor and which is connected to the input of the low-noise amplifier 2.

It may be provided that the R-mode receiver arrangement 1 comprises a computing device 5. The computing device 5 can be configured as a personal computer or a miniature computer or an embedded computer. The computing device 5 is configured to receive an output signal of the RTL software-defined radio receiver module 4 and to perform a Fourier transform on the output signal, in order to estimate phases 6 of both carrier signals of an R-mode signal and to provide and/or output the estimated phases 6.

It may be further provided that the computing device 5 is further configured to estimate and provide and/or output a pseudorange 7 based on the estimated phases 6.

It may be provided that the bandpass filter 3 has a passband from 250 kHz to 375 kHz.

Figure 2:
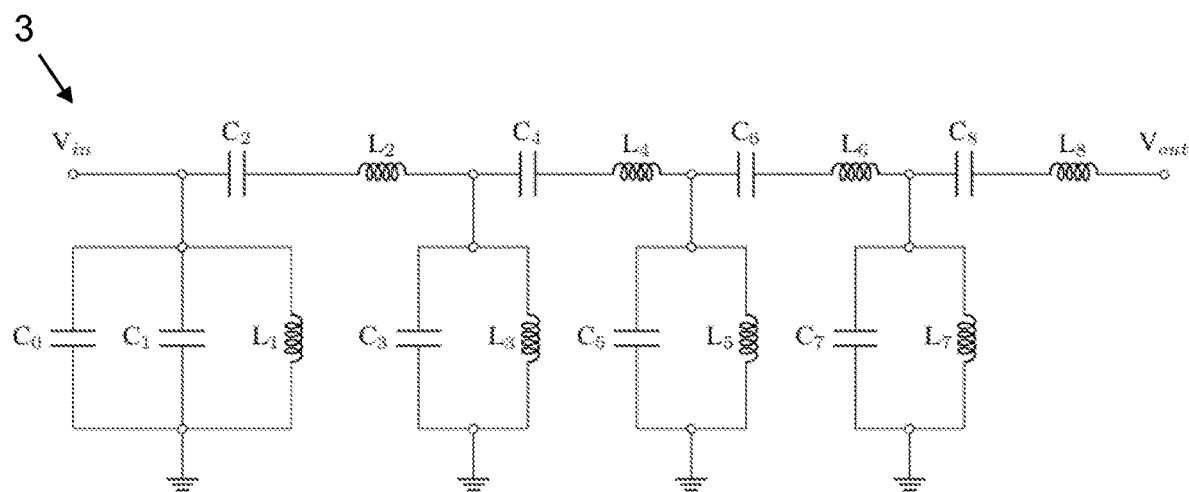
FIG. 2 shows, schematically, a diagram of a bandpass filter having discrete components.

Furthermore, it may be provided that the bandpass filter 3 is a passive filter formed by discrete components. This is shown schematically in FIG. 2. In particular, the discrete components shown can have the following values in order to provide a passband from 250 kHz to 375 kHz:

| Capacitor | $C_0$ | $C_1$ | $C_2$ | $C_3$ | $C_4$ | $C_5$ | $C_6$ | $C_7$ | $C_8$ |
|---|---|---|---|---|---|---|---|---|---|
| Value | 1.2 nF | 1.2 nF | 15 nF | 12 nF | 6.8 nF | 18 nF | 4.8 nF | 27 nF | 1.8 nF |

| Inductor | $L_1$ | $L_2$ | $L_3$ | $L_4$ | $L_5$ | $L_6$ | $L_7$ | $L_8$ |
|---|---|---|---|---|---|---|---|---|
| Value | 100 µH | 18 µH | 22 µH | 33 µH | 15 µH | 54 µH | 10 µH | 150 µH |

It may be provided that the computing device 5 is further configured to correct for phase drift.

LIST OF REFERENCE SIGNS

1 R-mode receiver arrangement
2 Low-noise amplifier
3 Bandpass filter
4 RTL software-defined radio receiver module
5 Computing device
6 Phase
7 Pseudorange
10 E-field antenna
11 H-field antenna
$C_x$ Capacitance/capacitor
$L_x$ Inductance/inductor
$V_{in}$ Input voltage
$V_{out}$ Output voltage

What is claimed is:

1. An R-mode receiver arrangement comprising:
a low-noise amplifier,
a bandpass filter, and
an RTL software-defined radio receiver module,
wherein an input of the low-noise amplifier is configured to be connectable to a receiving antenna, wherein an output of the low-noise amplifier is connected to the RTL software-defined radio receiver module via the bandpass filter;
wherein the bandpass filter has a passband from 250 kHz to 375 kHz.

2. The R-mode receiver arrangement as claimed in claim 1, wherein the RTL software-defined radio receiver module is configured to operate in a direct-sampling mode.

3. The R-mode receiver arrangement as claimed in claim 1, characterized by a computing device, wherein the computing device is configured to receive an output signal of the RTL software-defined radio receiver module and to perform a Fourier transform on the output signal, in order to estimate phases of both carrier signals of an R-mode signal and to provide and/or output the estimated phases.

4. The R-mode receiver arrangement as claimed in claim 3, wherein the computing device is further configured to estimate and provide and/or output a pseudorange based on the estimated phases.

5. The R-mode receiver arrangement as claimed in claim 1, wherein the bandpass filter is a passive filter formed by discrete components.

6. The R-mode receiver arrangement as claimed in claim 1, comprising a computing device, and wherein the computing device is further configured to correct for phase drift.

7. The R-mode receiver arrangement as claimed in claim 1, wherein an E-field antenna which has a circular receiving pattern is connected to the input of the low-noise amplifier.

8. The R-mode receiver arrangement as claimed in claim 1, wherein an H-field antenna which has a directional characteristic and a reduced noise floor is connected to the input of the low-noise amplifier.

9. The R-mode receiver arrangement as claimed in claim 2, characterized by a computing device, wherein the computing device is configured to receive an output signal of the RTL software-defined radio receiver module and to perform a Fourier transform on the output signal, in order to estimate phases of both carrier signals of an R-mode signal and to provide and/or output the estimated phases.

10. The R-mode receiver arrangement as claimed in claim 9, wherein the computing device is further configured to estimate and provide and/or output a pseudorange based on the estimated phases.

11. The R-mode receiver arrangement as claimed in claim 2, comprising a computing device, and wherein the computing device is further configured to correct for phase drift.

12. The R-mode receiver arrangement as claimed in claim 2, wherein an E-field antenna which has a circular receiving pattern is connected to the input of the low-noise amplifier.

13. The R-mode receiver arrangement as claimed in claim 3, wherein an E-field antenna which has a circular receiving pattern is connected to the input of the low-noise amplifier.

14. The R-mode receiver arrangement as claimed in claim 2, wherein an H-field antenna which has a directional characteristic and a reduced noise floor is connected to the input of the low-noise amplifier.

15. The R-mode receiver arrangement as claimed in claim 3, wherein an H-field antenna which has a directional characteristic and a reduced noise floor is connected to the input of the low-noise amplifier.

16. An R-mode receiver arrangement comprising:
a low-noise amplifier,
a bandpass filter, and
an RTL software-defined radio receiver module,
wherein an input of the low-noise amplifier is configured to be connectable to a receiving antenna, wherein an output of the low-noise amplifier is connected to the RTL software-defined radio receiver module via the bandpass filter;
wherein an E-field antenna which has a circular receiving pattern is connected to the input of the low-noise amplifier; and
wherein an H-field antenna which has a directional characteristic and a reduced noise floor is connected to the input of the low-noise amplifier.

17. The R-mode receiver arrangement as claimed in claim 16, wherein the bandpass filter has a passband from 250 kHz to 375 kHz.

* * * * *